United States Patent [19]

Hocker et al.

[11] 4,368,319
[45] Jan. 11, 1983

[54] ELECTRICALLY CONDUCTIVE CYCLIC POLYIMIDES

[75] Inventors: Jürgen Hocker, Bergisch-Gladbach; Rudolf Merten, Leverkusen; Hans G. Fitzky, Odenthal, all of Fed. Rep. of Germany

[73] Assignee: Bayer Aktiengesellschaft, Leverkusen, Fed. Rep. of Germany

[21] Appl. No.: 222,084

[22] Filed: Jan. 2, 1981

[30] Foreign Application Priority Data

Jan. 4, 1980 [DE] Fed. Rep. of Germany ....... 3000168

[51] Int. Cl.³ ..................... C08G 69/28; C08G 69/32
[52] U.S. Cl. .................. 528/353; 174/110 R; 174/110 N; 528/172; 528/208; 528/310; 528/352
[58] Field of Search ............................... 528/352, 353

[56] References Cited

U.S. PATENT DOCUMENTS

| | | | |
|---|---|---|---|
| 3,812,082 | 5/1974 | Jones | 260/49 |
| 3,981,847 | 9/1976 | Meyer et al. | 528/353 |
| 3,988,303 | 10/1976 | Korshak et al. | 528/353 |
| 4,086,215 | 4/1978 | Kurihara et al. | 528/352 |
| 4,197,397 | 4/1980 | D'Alelio | 528/353 |

FOREIGN PATENT DOCUMENTS 340685 12/1977 Austria .
1445769 3/1969 Fed. Rep. of Germany .
1800273 5/1969 Fed. Rep. of Germany .
1770796 12/1971 Fed. Rep. of Germany .
2904801 8/1979 Fed. Rep. of Germany .

*Primary Examiner*—H. S. Cockeram
*Attorney, Agent, or Firm*—Connolly and Hutz

[57] ABSTRACT

Film-forming polymers corresponding to the following Formula I:

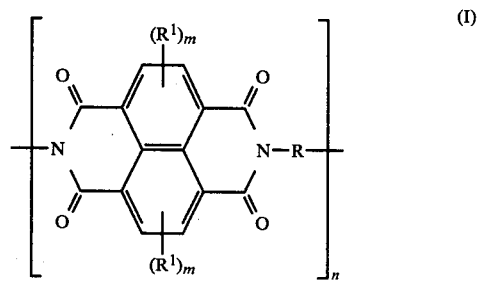

wherein
R represents a divalent aliphatic group containing an electric donor;
$R^1$ represents hydrogen, halogen, $-SO_3H$, $-CN$, $-COOR^2$, $-N(R^3)_2$, $-OR^4$ or $-NO_2$;
$R^2$, $R^3$ and $R^4$ represent hydrogen or $C_1-C_6$ alkyl; and
n represents an integer of from 2 to 1000, and m is 1 or 2.

2 Claims, No Drawings

ELECTRICALLY CONDUCTIVE CYCLIC POLYIMIDES

This invention relates to cyclic polyimides corresponding to the Formula I:

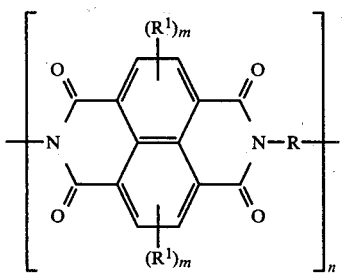

wherein

R represents a divalent aliphatic group containing an electron donor;

$R^1$ represents hydrogen, halogen, —$SO_3H$, —CN, —$COOR^2$, —$N(R^3)_2$, —$OR^4$ or —$NO_2$;

$R^2$, $R^3$ and $R^4$ independently represent hydrogen or $C_1$-$C_6$ alkyl, and n represents an integer of from 2 to 1000, preferably from 10 to 500, more preferably from 10 to 200, and m is 1 or 2.

The group R preferably represents a saturated or olefinically unsaturated aliphatic group having up to 12 carbon atoms, which must contain at least one heteroatom, such as oxygen or sulphur, or $NR^2$ ($R^2$ as defined above) in the main chain or in a side chain.

Cyclic polyimides corresponding to formula (I) wherein $R^1$ represents hydrogen and wherein the group R is derived from an alkylene triamine or an oxaalkylene diamine corresponding to general formulae (II) or (III) are particularly preferred:

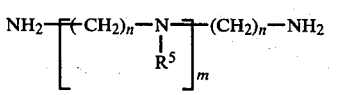

$R^5$ represents H, alkyl or $CR^2O$; and
n represents 1-4;
m represents 1 to 5 or

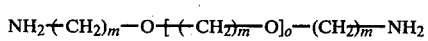

m represents 1-4; and
o represents zero-2.

The reaction products of naphthalene-1,4,5,8-tetracarboxylic acid dianhydride with diethylene triamine, triethylene tetramine, tetraethylene pentamine and the N-methyl derivatives thereof are particularly preferred, but the polyamines II must contain two free amino end groups; 1,4-bis-(3-aminopropyl)-piperazine is also particularly preferred.

The cyclic imides according to the present invention are film-forming polymers. Some of them have electric conductivities of more than $10^{-8} \Omega^{-1} cm^{-1}$ which may increase by more than two powers of 10 on exposure to a xenon high pressure lamp so that they may be used as semiconductors and as photoconductors.

The polymeric cyclic imides according to the present invention can be prepared by known methods.

For example, naphthalene-1,4,5,8-tetracarboxylic acid dianhydride or naphthalene-1,4,5,8-tetracarboxylic acid, wherein the aromatic rings may be substituted by the groups $R^1$, may be reacted with a diamine which yields the group R including the two nitrogen atoms. This reaction may be carried out in an organic solvent, such as dimethylformamide, N-methylpyrrolidone, pyridine, formic acid, acetic acid, dimethylsulphoxide, dimethylacetamide or mixtures thereof. The reaction may also be carried out solvent-free. The water produced by the reaction may either be taken up by the solvent or removed by distillation. The reaction may also be carried out in two stages, the dicarboxylic acid and the diamine being converted to the amic acid in the first stage and to the polyimide in the second stage. The reactants are generally used in approximately stoichiometric quantities and the reaction in most cases begins at temperatures of from about 0° to about 80° C. It is advisable to maintain the reaction mixture at temperatures of from about 80° to about 120° C. for some time after termination of the main reaction in order to complete the reaction. If the reaction is incomplete, some of the carboxylic acid and carboxylic acid anhydride groups originally present may be present as open chain amic acid groups.

If the aliphatic chain R contains an NH function, the corresponding acylation products may be obtained if the reaction is carried out in the presence of organic acids, such as formic or acetic acid, as solvents. When R contains an $NR^2$ function, the cyclic polyamides obtained may be converted into the ammonium salts of inorganic or organic acids. These derivatives are water-soluble and may be precipitated by the addition of bases.

The polyimides according to the present invention can be used, e.g., as semiconductive or photoconductive polymers, in particular as lacquers, e.g. in reproduction work, as heating lacquers for printed circuits and as optoelectronic structural elements.

EXAMPLE 1, METHOD A

A solution of 4.15 parts, by weight, of bis-(2-aminoethyl)-amine in 50 parts, by weight, of pyridine is added dropwise at room temperature to a suspension of 100 parts, by weight, of dimethylformamide, 50 parts, by weight, of pyridine and 10.72 parts, by weight, of naphthalene tetracarboxylic acid dianhydride under nitrogen. The reaction mixture is stirred for 4 hours at 100° C., cooled and suction filtered. 10 parts, by weight, of polymer (IV) is obtained after drying at 50° C.

Analysis: Calculated: C, 64.48; H, 3.91; N, 12.53; O, 19.08. Observed: C, 63.2; H, 4.4; N, 11.9; O, 19.1.

IR (KBr): 1700, 1655 $cm^{-1}$ ($\nu co$)

NMR ($CD_3COOD$): $\delta = 8.83$ ppm (4H), 4.8 ppm (4H), 3.9 ppm (4H).

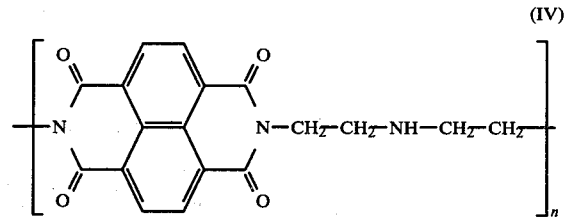

Specific conductivity: $4.4 \cdot 10^{-3} \Omega^{-1} cm^{-1}$.

EXAMPLE 1, METHOD B

A solution of 4.15 parts, by weight, of bis-(2-aminoethyl)-amine in 50 parts, by weight, of pyridine is added dropwise at room temperature to a suspension of 10.72 parts, by weight, of naphthalene tetracarboxylic acid dianhydride in 150 parts, by volume, of acetic acid under nitrogen and the reaction mixture is heated to 100° C. for 5 hours. After cooling to room temperature, 9.7 parts, by weight, of a polymer which is shown to be the mono-acetate of polymer (IV) and gives an additional signal in the NMR spectrum at $\delta = 2.25$ ppm are isolated by suction filtration.

EXAMPLE 2

A suspension of 100 parts, by weight, of dimethylformamide, 50 parts, by weight, of pyridine and 10.72 parts, by weight, of naphthalene tetracarboxylic acid dianhydride is reacted with a solution of 5.25 parts, by weight, of bis-(3-aminopropyl)-amine in 50 parts, by weight, of pyridine by a method analogous to Method A of Example 1. 14.9 parts, by weight, of polymer (V) are obtained.

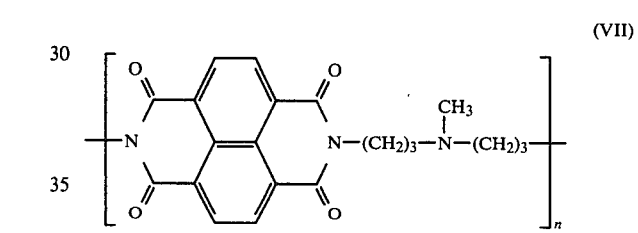

EXAMPLE 3

A suspension of 100 parts, by weight, of dimethyl formamide, 50 parts, by weight, of pyridine and 10.72 parts, by weight, of naphthalene tetracarboxylic acid dianhydride is reacted with a solution of 8.16 parts, by weight, of butane diol-(1,4)-bis-(3-aminopropylether) by a method analogous to Method A of Example 1. 15 parts, by weight, of a polymer (VI) are obtained.

Calculated for (VI): C, 66.05; H, 5.55; N, 6.42; O, 22.00. Observed: C, 65.0; H, 5.8; N, 6.2; O, 22.6.

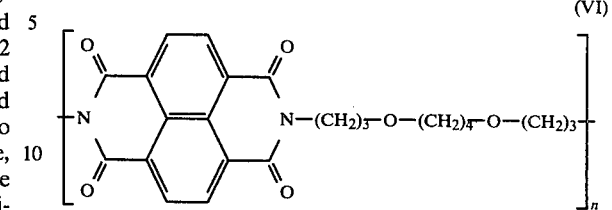

An identical polymer is obtained by reaction of the starting materials by Method 1 B. Specific conductivity: $1.35 \cdot 10^{-3} \Omega^{-1} cm^{-1}$.

(Microwave measurement, measuring frequency 9 GHz).

EXAMPLE 4

The reaction is carried out using 5.8 parts, by weight, of methyl-bis-(3-aminopropyl)-amine by a method analogous to Method A of Example 1. 14.8 parts, by weight, of a polymer corresponding to the idealised structure (VII) are obtained.

Calculated for (VII): C, 66.84; H, 5.08; N, 11.14; O, 16.96. Observed: C, 65.1; H, 5.2; N, 10.7; O, 17.9.

The specific conductivity is $4.2 \cdot 10^{-8} \Omega^{-1} cm^{-1}$ (Direct current, measuring voltage 100 V).

EXAMPLES 5 To 22

The following di- and poly-amines were reacted with naphthalene tetracarboxylic acid dianhydride by a method analogous to Method A of Example 1:

| Example No. | | IR [cm$^{-1}$] | | | NMR [δ/ppm] or analysis | | |
|---|---|---|---|---|---|---|---|
| 5 | H$_2$N—(CH$_2$—CH$_2$—NH)$_x$—CH$_2$—CH$_2$—NH$_2$  x = 2 | 1700/1660 | | 9,0 (4H), | 4,85 (4H), | 4,0 (8H) | |
| 6 | x = 3 | 1700/1655 | calc. observ. | C 62,7  59,9 | H 5,52  5,6 | N 16,64  15,3 | O 15,21  16,5 |
| 7 | x = 4 | 1700/1660 | | | | | |
| 8 | H$_2$N—(CH$_2$)$_3$—N—(CH$_2$)$_3$—NH$_2$  \| (CH$_2$)$_3$—N(CH$_3$)$_2$ | 1710/1665 | | C 66,80  66,25 | H 6,30  6,45 | N 12,48  12,65 | O 14,26  14,65 |
| (1)9 | H$_2$N—(CH$_2$)$_3$—N—(CH$_2$)$_3$—NH$_2$  \| (CH$_2$)$_3$—OC$_4$H$_9$ | 1705/1660 | | 9,0 (4H),  1,6 (4H), | 4,6 (4H),  0,95 (3H) | 3,7 (10H), | 2,5 (6H), |
| 10 | H$_2$N—(CH$_2$)$_2$—CH—(CH$_2$)$_3$—NH$_2$  \| N(CH$_3$)$_2$ | 1705/1660 | | 9,0 (4H),  2,45 (2H), | 4,55 (4H),  2,15 (4H) | 3,65 (1H), | 3,2 (6H) |
| (2)11 | H$_2$N—(CH$_2$)$_3$—N—(CH$_2$)$_3$—NH$_2$  \| C$_4$H$_9$ | 1705/1660 | calc. observed | C 68,65  67,5 | H 6,01  6,15 | N 10,02  10,20 | O 15,26  15,15 |

-continued

| Example No. | | IR [cm$^{-1}$] | NMR [δ/ppm] or analysis | | | | |
|---|---|---|---|---|---|---|---|
| 12 | H$_2$N—(CH$_2$)$_3$—O—(CH$_2$)$_2$—O(CH$_2$)$_3$—NH$_2$ (according to Method 1 B) | 1700/1660 | calc. observed | C 64,5 64,2 | H 4,92 5,05 | N 6,85 6,6 | O 23,5 24,1 |
| 13 | H$_2$N—CH$_2$—CH$_2$—S—CH$_2$—CH$_2$—NH$_2$ | 1700/1660 | | | | | |
| 14 | (H$_2$N—CH$_2$—CH$_2$—S—C$_4$H$_8$)$_2$O | 1705/1665 | | | | | |
| 15 | H$_2$N—⟨⟩—NH—(CH$_2$)$_3$—NH$_2$ | 1700/1660 | | | | | |
| 16 | [H$_2$N—CH(CH$_3$)—CH$_2$—NH—C(=O)—]$_2$ | 1700/1660 | calc. observed | C 60.8 4.17 H | 4.17 N 4.6 | 12.9 O 12.2 | 22.1 23.7 |
| 17 | [H$_2$N—(CH$_2$)$_6$—NH—C(=O)—CH$_2$—]$_2$ | | 9.0 (4H), | 4.4 (4H), | 3.6 (4H), | 2.8 (8H) 1.4–2.2 (8H) | |
| 18 | [H$_2$N—(CH$_2$)$_3$—O—(CH$_2$)$_2$—]$_2$O | 1705/1660 | calc. observed | C 63.7 63.5 | H 5.35 5.9 | N 6.19 6.15 | O 24.78 24.75 |
| 19 | [H$_2$N—(CH$_2$)$_3$—O—CH$_2$—]$_2$C(CH$_3$)$_2$ | 1700/1660 | calc. observed | C 66.66 66.5 | H 5.81 5.85 | N 6.22 6.25 | O 21.31 22.0 |
| 20 | [H$_2$N—(CH$_2$)$_3$—NH—CH$_2$—]$_2$ | 1705/1660 | | | | | |
| (3)21 | H$_2$N—(CH$_2$)$_4$—NH—(CH$_2$)$_4$—NH$_2$ | 1700/1660 | calc. observed | C 66.8 65.1 | H 5.06 5.55 | N 11.14 10.55 | O 16.97 17.6 |
| 22 | H$_2$N—(CH$_2$)$_3$—N⟨piperazine⟩N—(CH$_2$)$_3$—NH$_2$ | 1705/1655 | | | | | |

(1)Dark conductivity: $1.0 \cdot 10^{-3} \Omega^{-1}$ cm$^{-1}$ (Microwave measurement at 9 GHz); rises to $1.8 \cdot 10^{-3} \Omega^{-1}$ cm$^{-1}$ (Microwave measurement at 9 GHz) after 20 minutes exposure to a Xenon high pressure lamp. The bisacetate (reaction product with 2 mol of acetic acid) is found to have a dark conductivity of $1.3 \cdot 10^{-4} \cdot \Omega^{-1} \cdot$ cm$^{-1}$.
(2)Specific conductivity: $3.2 \cdot 10^{-3} \Omega^{-1}$ cm$^{-1}$ (Microwave measurement at 9 GHz).
(3)A film of polyimide 20 was prepared on an aluminium sheet. The film was found to have a specific conductivity at 25° C. of $10^{-8} \cdot \Omega^{-1} \cdot$ cm$^{-1}$, rising at 150° C. to $10^{-5} \Omega^{-1}$ cm$^{-1}$ (measuring voltage 1 V, direct current). The surface conductivity 1/RoA according to DIN 53 482/IEC167 is $5 \times 10^{-7} \Omega^{-1}$ at 25° C. and rises on exposure to a mercury high pressure lamp to $10^{-5} \Omega^{-1}$.

EXAMPLE 23

14.5 parts, by weight, of methyl-bis-(3-aminopropyl)-amine are reacted with 30.3 parts, by weight, of 2-chloronaphthalene tetracarboxylic acid dianhydride by a method analogous to Method A of Example 1. 39.5 parts, by weight, of polymer (XXIII) are obtained.

Analysis: Calculated: C, 61.26; H, 4.41; N, 10.20; Cl, 8.61. Observed: C, 60.9; H, 4.5; N, 10.4; Cl, 8.9.

IR (KBr): 1705/1668 cm$^{-}$(νco)

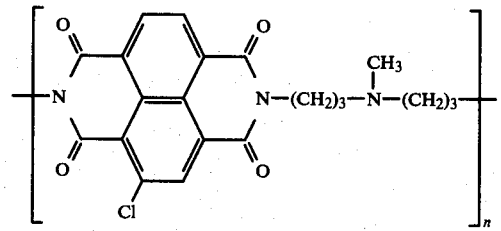

(XXIII)

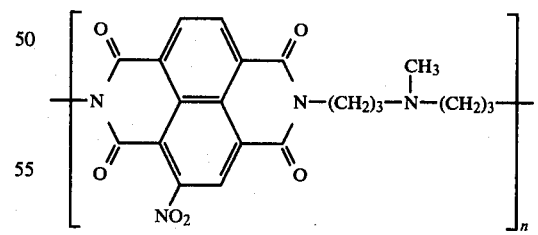

(XXIV)

EXAMPLE 24

14.5 parts, by weight, of methyl-bis-(3-aminopropyl)-amine are reacted with 31.3 parts, by weight, of 2-nitronaphthalene tetracarboxylic acid dianhydride by a method analogous to Method A of Example 1. 43.2 parts, by weight, of polymer (XXIV) are obtained.

Analysis: Calculated: C, 59.71; H, 4.30; N, 13.27. Observed: C, 60.1; H, 4.4; N, 13.7.

IR (KBr): 1708/1660 cm$^{-1}$ (νco)

EXAMPLE 25

14.5 parts, by weight, of methyl-bis-(3-aminopropyl)-amine are reacted with 31.2 parts, by weight, of naphthalene pentacarboxylic acid dianhydride by a method analogous to Method A of Example 1. 38.2 parts, by weight, of Polymer (XXV) are obtained.

Analysis: Calculated: C, 62.70; H, 4.55; N, 9.97. Observed: C, 63.0; H, 4.7; N, 10.2.

IR (KBr): 1704/1658 cm$^{-1}$ (νco)

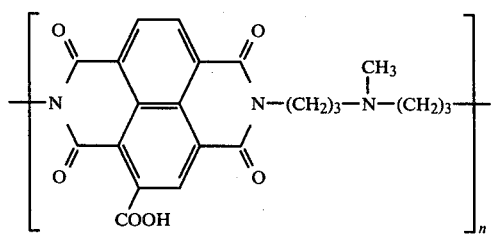

(XXV)

EXAMPLE 26

13.1 parts, by weight, of bis-(3-aminopropyl)-amine are reacted with 40.6 parts, by weight, of tetrachloronaphthalene tetracarboxylic acid dianhydride by a method analogous to Method B of Example 1. 52.5 parts, by weight, of polymer (XXVI) are obtained.

Analysis: Calculated: C, 47.93; H, 2.62; N, 8.39; Cl, 28.30. Observed: C, 47.6; H, 2.5; N, 8.7; Cl, 27.9.

IR (KBr): 1712/1664 cm$^{-1}$ ($\nu$co)

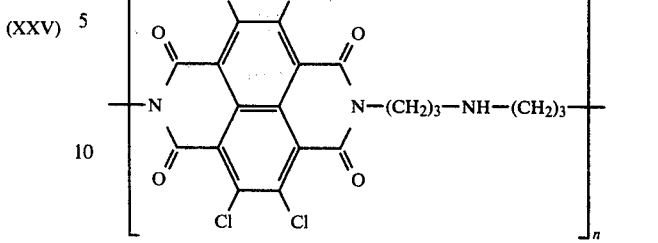

(XXVI)

We claim:
1. A film-forming polymeric cyclic polyimide of the formula

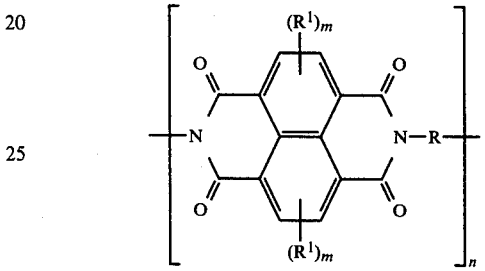

wherein R is a divalent aliphatic group containing an electron donor; $R^1$ is hydrogen, halogen, —CN, —NO$_2$, —COOR$^2$, —N(R$^3$)$_2$ or —OR$^4$; $R^2$ is alkyl having 1 to 6 carbon atoms; $R^3$ and $R^4$ independently are hydrogen or alkyl having 1 to 6 carbon atoms; m is 1 or 2 and n is an integer of from 10 to 500.

2. A semiconductor or photoconductor which comprises a cyclic polyimide of claim 1.

* * * * *